United States Patent [19]
Sugita

[11] Patent Number: 5,790,883
[45] Date of Patent: Aug. 4, 1998

[54] MULTIPLE PORTS STORAGE DEVICE WITH PROGRAMMABLE OVERLAPPED DATA BITS ACCESS

[75] Inventor: Mitsuru Sugita, Hyogo, Japan

[73] Assignees: Mitsubishi Denki Kabushiki Kaisha, Tokyo; Mitsubishi Electric Semiconductor Software Co., Ltd., Hyogo, both of Japan

[21] Appl. No.: 501,228

[22] Filed: Jul. 11, 1995

[30] Foreign Application Priority Data

Feb. 7, 1995 [JP] Japan .................. 7-019214

[51] Int. Cl.$^6$ .................. G11C 8/00; G11C 7/00
[52] U.S. Cl. .................. 395/821; 711/149; 365/189.04; 365/230.05; 395/800.38
[58] Field of Search .................. 365/154, 189.04, 365/230.05; 395/436, 401, 428, 458, 495, 823, 839, 828, 832, 821, 800.38; 711/149, 150, 153, 211

[56] References Cited

U.S. PATENT DOCUMENTS

| | | | |
|---|---|---|---|
| 4,610,004 | 9/1986 | Moller et al. | 365/230.05 |
| 4,710,896 | 12/1987 | Nagami | 365/149 |
| 4,893,280 | 1/1990 | Gelsomini et al. | 365/230.05 |
| 4,961,171 | 10/1990 | Pinkham et al. | 365/230.05 |
| 5,023,844 | 6/1991 | Arnold et al. | 365/230.05 |
| 5,040,149 | 8/1991 | Ebihara et al. | 365/189.05 |
| 5,146,572 | 9/1992 | Bailey et al. | 395/200.66 |
| 5,177,706 | 1/1993 | Shinohara et al. | 365/189.04 |
| 5,307,321 | 4/1994 | Sasai et al. | 365/230.03 |
| 5,355,335 | 10/1994 | Katsuno | 365/189.04 |
| 5,357,620 | 10/1994 | Suzuki | 395/421.1 |
| 5,418,745 | 5/1995 | Watanabe | 365/189.05 |
| 5,424,995 | 6/1995 | Miyazaki et al. | 365/230.05 |
| 5,434,818 | 7/1995 | Byers et al. | 365/189.04 |
| 5,442,770 | 8/1995 | Barratt | 395/403 |
| 5,459,851 | 10/1995 | Nakajima et al. | 711/149 |
| 5,481,755 | 1/1996 | Harper et al. | 395/823 |
| 5,502,683 | 3/1996 | Marchioro | 365/230.05 |
| 5,530,897 | 6/1996 | Meritt | 395/829 |
| 5,559,749 | 9/1996 | McLaury | 365/230.02 |
| 5,561,638 | 10/1996 | Gibson et al. | 365/230.05 |
| 5,590,087 | 12/1996 | Chung et al. | 365/230.05 |

FOREIGN PATENT DOCUMENTS

| | | | |
|---|---|---|---|
| 4129250 C2 | 9/1991 | Germany | G11C 11/412 |
| 39 06 895 C2 | 8/1993 | Germany. | |
| 61-175998 | 8/1986 | Japan. | |
| 61-221841 | 10/1986 | Japan. | |
| 63-239680 | 10/1988 | Japan. | |
| 5-282869 | 10/1993 | Japan. | |
| 6-19780 | 1/1994 | Japan. | |

*Primary Examiner*—Dinh C. Dung
*Attorney, Agent, or Firm*—McDermott, Will & Emery

[57] ABSTRACT

A storage portion places data through a data output buffer on a data line $D0_P$ when a control line R00H becomes active, and places data through a data output buffer on a data line $D0_Q$ when a control line R03H becomes active. The storage portion further takes as input a signal on the data line $D0_P$ through a transmission gate when a control line W00H becomes active, and takes as input a signal on the data line $D0_Q$ through a transmission gate when a control line W03H becomes active. Thus, a storage device is provided to have the storage portion accessed by a plurality of access means at different addresses. It is thereby possible to select the optimal method of access to the storage portion, resulting in prevention of reduction of a program efficiency.

7 Claims, 13 Drawing Sheets

|  | READ | WRITE |
|---|---|---|
| 00H ☐ | ○ | ○ |
| 01H ☐ | ○ | ○ |
| 02H ☐ | ○ | ○ |
| 03H ☐ | ○ | × |

- TA CONTROL BITS
- TA STATUS FLAG
- TA ENABLE FLAG

FIG. 7 (B) 01H

- TB CONTROL BITS
- TB STATUS FLAG
- TB ENABLE FLAG

FIG. 7 (C) 00H

- TA STATUS FLAG
- TA ENABLE FLAG
- TB STATUS FLAG
- TB ENABLE FLAG

FIG. 7 (D) 01H

- TA CONTROL BITS
- TB CONTROL BITS

| | | | | |
|---|---|---|---|---|
| 00H | TA En | TA St | TA C2 | TA C1 |
| 01H | TB En | TB St | TB C2 | TB C1 |
| 02H | TC En | TC St | TC C2 | TC C1 |
| 03H | TD En | TD St | TD C2 | TD C1 |
| 04H | TD En | TC En | TB En | TA En |
| 05H | TD St | TC St | TB St | TA St |
| 06H | TD C2 | TC C2 | TB C2 | TA C2 |
| 07H | TD C1 | TC C1 | TB C1 | TA C1 |
| 08H | TA C1 | TA C2 | TA St | TA En |
| 09H | TB C1 | TB C2 | TB St | TB En |
| 0AH | TC C1 | TC C2 | TC St | TC En |
| 0BH | TD C1 | TD C2 | TD St | TD En |
| 0CH | TA En | TB En | TC En | TD En |
| 0DH | TA St | TB St | TC St | TD St |
| 0EH | TA C2 | TB C2 | TC C2 | TD C2 |
| 0FH | TA C1 | TB C1 | TC C1 | TD C1 |

00H–07H: READ, WRITE PERMISSIBLE
08H–0FH: READ-ONLY

ized to have different bit configura-

MULTIPLE PORTS STORAGE DEVICE WITH PROGRAMMABLE OVERLAPPED DATA BITS ACCESS

BACKGROUND OF THE INVENTION

1. Field of the Invention

The present invention relates to a storage device used for, for example, a register for controlling peripheral devices in a one-chip microcomputer.

2. Description of the Related Art

Figure 11A:
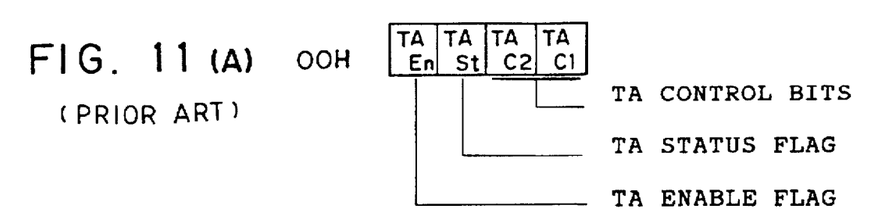
FIGS. 11(A) and 11(B) are explanatory diagrams showing address assignment and bit assignment of conventional timer control registers.
Figure 11B:
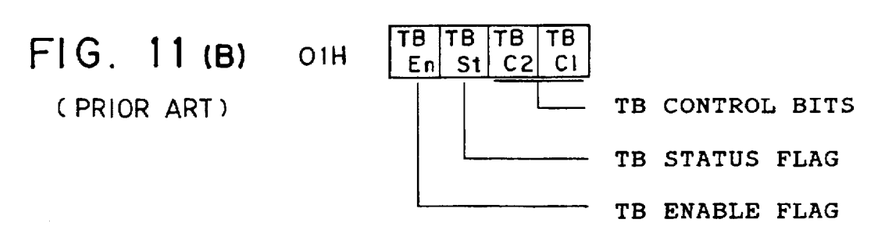

FIGS. 11(A) and 11(B) are explanatory diagrams showing illustrative timer control registers built in a conventional one-chip microcomputer. FIG. 11(A) shows a register assigned to an address 00[H] for controlling a first timer, and FIG. 11(B) shows a register assigned to an address 01[H] for controlling a second timer. In the following discussion, the first timer will be referred to as a timer A (TA), and the second timer will be referred to as a timer B (TB). In the respective registers, a C1 bit and a C2 bit serve as a control bit which is set according to a mode set command from a CPU for an operation mode or the like. An En bit serves as a bit showing an enable flag En which is set according to an instruction from the CPU to start or stop a counter. An St bit serves as a bit showing a status flag St to indicate a timer state such as ON-OFF states.

A description will now be given of the operation. In order to start the timer, the CPU is operated to set the control bits C1 and C2 to values corresponding to a desired mode, and turn ON the enable flag En. When the TA and the TB are concurrently controlled, the CPU is operated to have access to the respective control bits of the TA control register and the TB control register, that is, the C1 bits and the C2 bits. Thus, discrete accesses to the two registers are required so that the TA and the TB can not be started entirely concurrently.

Figure 12:
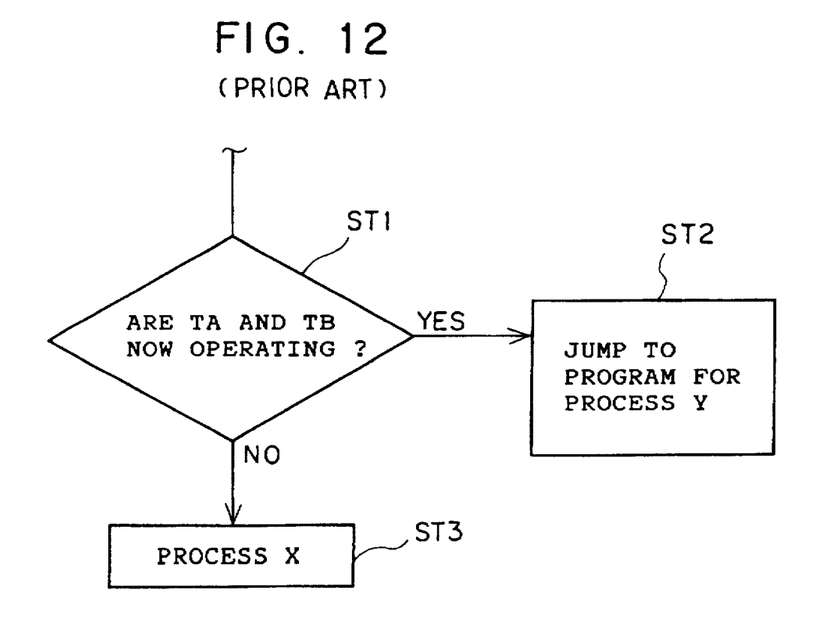
FIG. 12 is a flowchart showing a program to check a timer operation.
Figure 13:
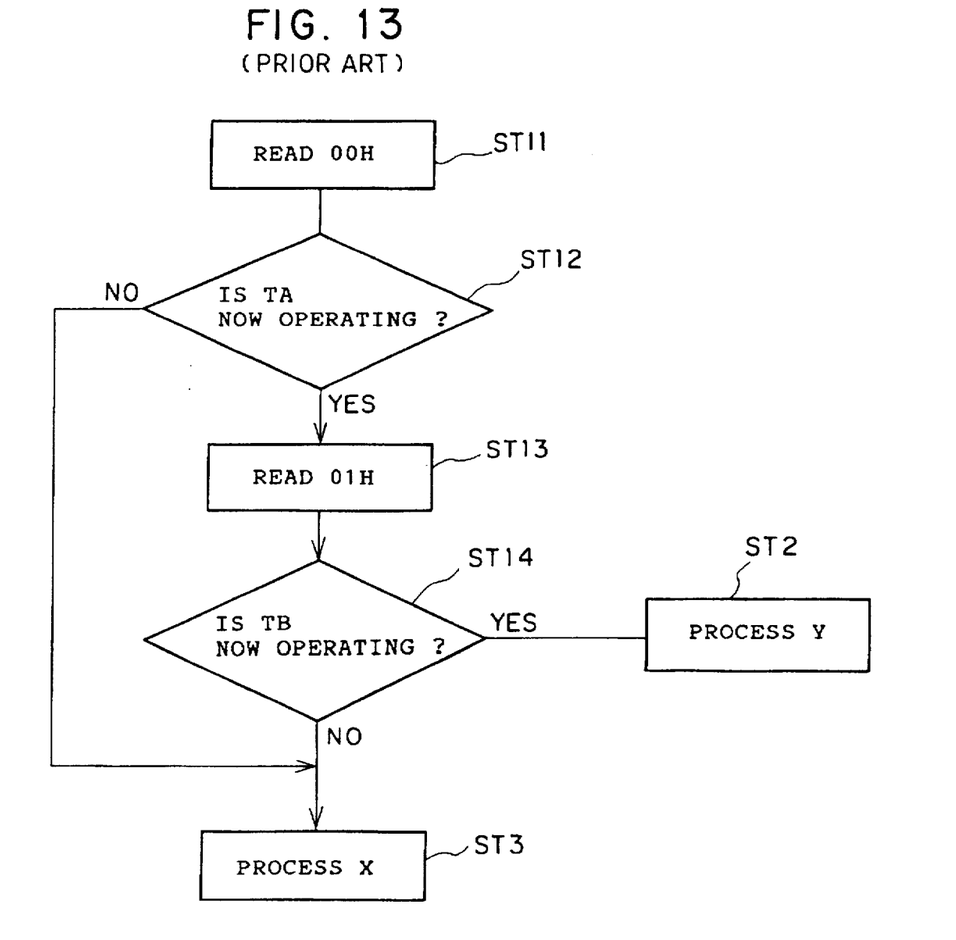
FIG. 13 is a flowchart showing a detailed program to check the timer operation.

It is assumed that the CPU is operated to execute a program as shown in FIG. 12. In the program, the operation proceeds to process Y when both the TA and the TB are operated in process (Steps ST1 and ST2), and otherwise the CPU is operated to carry out process X (Step ST3). In execution of the program, specific process as shown in FIG. 13 is carried out. That is, the CPU is operated to initially read out contents of the TA control register (Step ST11) so as to make a state decision of the status flag St in the register (Step ST12). If the status flag St is in an OFF state, the process X is carried out (Step ST3). Otherwise, contents of the TB control register is read out (Step ST13) to make a state decision of the status flag St in the register (Step ST14). If the status flag St is in an ON state, the operation proceeds to the process Y (Step ST2). If in the OFF state, the process X is carried out (Step ST3).

As set forth above, when a decision is made in Step ST1, the CPU should be operated to have access to the respective status flags St of the TA control register and the TB control register so as to make the state decision of the respective status flags. Therefore, the decision in Step ST1 requires many steps. As a result, the process is time consuming and a size of the program is increased.

Figure 14:
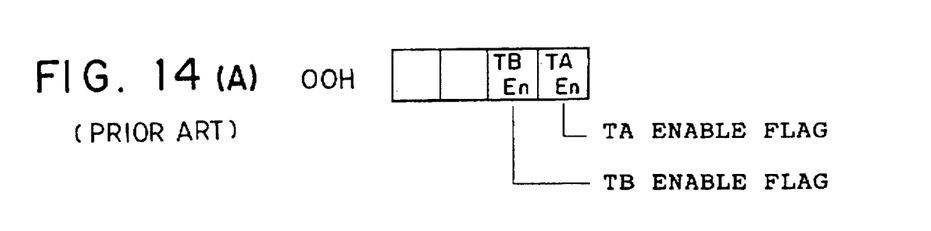
FIGS. 14(A) to 14(C) are explanatory diagrams respectively showing address assignment and bit assignment of other conventional timer control registers.

Consequently, as shown in FIGS. 14(A) to 14(C), one method may be applied in which, for example, flags having the same function are assigned to one register. FIG. 14(A) shows a register assigned to the address 00[H] including the enable flag En of the TA and the start flag En of the TB. FIG. 14(B) shows a register assigned to the address 01[H] including the status flag St of the TA and the status flag St of the TB. Further, FIG. 14(C) shows a register assigned to an address 02[H] including the control bits (i.e., the C1 bit and the C2 bit) of the TA and the control bits (i.e., the C1 bit and the C2 bit) of the TB.

It is assumed that the program as shown in FIG. 12 is carried out by the CPU when there are provided a group of timer control registers including the above structure. In this case, the CPU is merely operated to read out contents of the register at the address 01[H] to make a state decision of two bits in the contents, thereby completing the process in Step ST1. Further, it is possible to entirely concurrently start two timers by writing "0011" onto the register at the address 00[H] after mode setting.

Though a description has been given of the four-bit register serving as a storage device, for example, an eight-bit register enables concurrent control of more timers.

However, when the structures as shown in FIGS. 14(A) to 14(C) are employed, in order to start one timer, it is necessary to write the operation mode and so forth onto the register at the address 02[H], and turn ON the start flag En in the register at the address 00[H]. That is, the start of the one timer requires the access to the two registers. As a result, the program for starting the one timer many times should be provided in a more increased size.

A conventional storage device is provided as described above. Hence, even when address assignment is carried out from one viewpoint of a control target element (such as timer A, or timer B) as shown in FIGS. 11(A) and 11(B), or from another viewpoint of a control target function (such as start, control, or state) as shown in FIGS. 14(A) to 14(C), there is a problem in that a size of the control program is more increased and a long time is required for control. Further, there is another problem in that complex control prevents simplified production of the program.

SUMMARY OF THE INVENTION

In order to overcome the above problems, it is an object of the present invention to provide a storage device in which a size of a program is not increased, and a long time is not required for control, and production of the program can be simplified, that is, a storage device in which reduction of a program efficiency can be avoided.

The prior art related to an access method in a storage device, but is not focused upon the program efficiency, is disclosed in, for example, Japanese Patent Publications (Kokai) Nos. 61-221841, 61-175998, 63239680, 6-19780, and 5-282869.

According to the first aspect of the present invention, for achieving the above-mentioned objects, there is provided a storage device including a plurality of access means corresponding to different addresses, for respectively providing access to data of a storage portion. The access means can provide access to one storage portion from a plurality of different directions.

According to the second aspect of the present invention, there is provided a storage device having first access means for providing concurrent access to a predetermined number of storage portions in a plurality of storage portions, and second access means for providing concurrent access to a predetermined number of storage portions including the storage portions accessed by the first access means and other storage portions not accessed by the first access means. The two access means provide concurrent access to one storage portion as well as other storage portions. That is, the access is gained to the storage portion serving as one bit in a parallel data. In this case, the parallel data accessed by the two access means are produced to have different bit configurations.

According to the third aspect of the present invention, there is provided a storage device in which first access means includes a first data line to pass data to a storage portion and data from the storage portion, and a first control line to connect the storage portion to the first data line, and the second access means includes a second data line to pass data to the storage portion and data from the storage portion, and a second control line to connect the storage portion to the second data line, and the data lines mutually cross at right angles, and the control lines mutually cross at right angles. The mutual data lines and the mutual control lines cross at right angles in a chip, thereby providing a smaller chip forming a storage element.

According to the fourth aspect of the present invention, there is provided a storage device in which first access means includes a first data line to pass data to a storage portion and data from the storage portion, and a first control line to connect the storage portion to the first data line, and second access means includes a second data line to pass data to the storage portion and data from the storage portion, and a second control line to place the data from the storage portion on the second data line and inhibit data input from the second data line into the storage portion. The second access means inhibits the data input into the storage portion from the second data line, thereby avoiding erroneous modification of data in the storage portion due to erroneous access.

According to the fifth aspect of the present invention, there is provided a storage device in which a first control line and a second control line use a signal generated by an address signal from the data access side such as CPU. Access means provide access to a storage portion on the basis of the address signal generated from the data access side such as CPU.

According to the sixth aspect of the present invention, there is provided a storage device further including a control register whose control value is set by the data access side such as CPU. Further, a first control line and a second control line use a signal generated by both an address signal from the data access side and the control value. Access means provide access to a storage portion on the basis of the address signal from the data access side such as CPU and the control value, thereby reducing the number of addresses required for the access to the storage portion.

According to the seventh aspect of the present invention, there is provided a storage device further having third access means including a third data line to pass data to a storage portion and data from the storage portion, and a third control line to connect the storage portion to the third data line. In the storage device, the third control line connects the storage portion to the third data line so as to provide access in a batch data format including bits in the order opposed to the order of bits in a batch data accessed by either or both of the first access means and the second access means. The third access means can provide access to parallel data having bits in the order opposed to the order of bits in parallel data accessed by other access means.

According to the eighth aspect of the present invention, there is provided a storage device having first access means including a first data line to pass data to a storage portion and data from the storage portion, and a first control line to connect the storage portion to the first data line, for providing concurrent access to a predetermined number of storage portions in a plurality of storage portions, and third access means including a third data line to pass data to a storage portion and data from the storage portion, and a third control line to connect the storage portion to the third data line, for outputting, from the storage portions, batch data having bits in the order opposed to that of bits in a batch data accessed by the first access means. Further, the mutual data lines and the mutual control lines cross at right angles. The crossing data lines and the crossing control lines cross at right angles in a chip, thereby providing a smaller chip forming a storage element.

The above and further objects and novel features of the invention will more fully appear from the following detailed description when the same is read in connection with the accompanying drawings. It is to be expressly understood, however, that the drawings are for purpose of illustration only and are not intended as a definition of the limits of the invention.

DETAILED DESCRIPTION OF THE PREFERRED EMBODIMENTS

Embodiment 1

Figure 1:
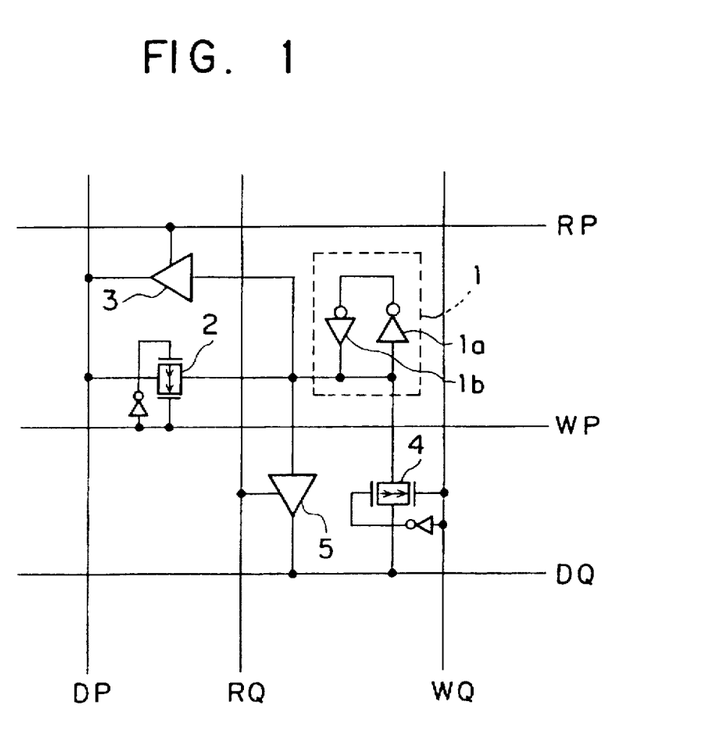
FIG. 1 is a circuit diagram showing a structure of a memory cell in a storage device.

FIG. 1 is a circuit diagram showing a structure of each memory cell in a storage device. In the drawing, reference numeral 1 means a storage portion formed by interconnecting inputs/outputs of an inverter 1*a* and a high-resistance inverter 1*b*. 2 is a transmission gate (TG) to pass data on a data line DP to the side of the storage portion 1 according to a data write signal on a control line WP. 3 is a data output buffer (RB) to place data of the storage portion 1 on the data line DP according to a data read signal on the control line RP, 4 is another TG to pass data on a data line DQ to the side of the storage portion 1 according to a data write signal on a control line WQ, and 5 is another RB to place data of the storage portion 1 on a data line DQ according to a data read signal on a control line RQ.

Here, the TGs 2 and 4, the RBs 3 and 5, the data lines DP and DQ, and the control lines WP, RP, WQ, and RQ form access means.

Figure 2:
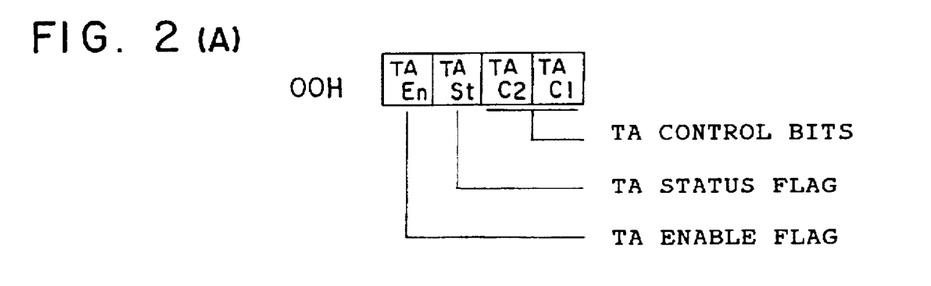
FIGS. 2(A) to 2(D) are explanatory diagrams respectively showing address assignment and bit assignment of timer control registers built in a one-chip microcomputer.

FIGS. 2(A) to 2(D) are explanatory diagrams showing address assignment and bit assignment of timer control registers built in a one-chip microcomputer serving as an illustrative storage device. FIG. 2(A) shows a TA control register assigned to an address 00[H], and FIG. 2(B) shows a TB control register assigned to an address 01[H]. FIG. 2(C) shows a register assigned to an address 02[H] in order to read out a status flag St and set an enable flag En, and FIG. 2(D) shows a register assigned to an address 03[H] and including control bits.

Each bit of the registers includes the memory cell shown in FIG. 1. For example, a memory cell to implement the zeroth bit (TAC1 bit) of the register at the address 00[H] is identical with a memory cell to implement the zeroth bit of the register at the address 03[H]. In FIGS. 2(A) to 2(D), other two bits shown by the same name are implemented by one memory cell. That is, though 16 bits (four by four) are shown in FIGS. 2(A) to 2(D), eight memory cells form a group of registers shown in FIGS. 2(A) to 2(D) in reality.

Figure 3:
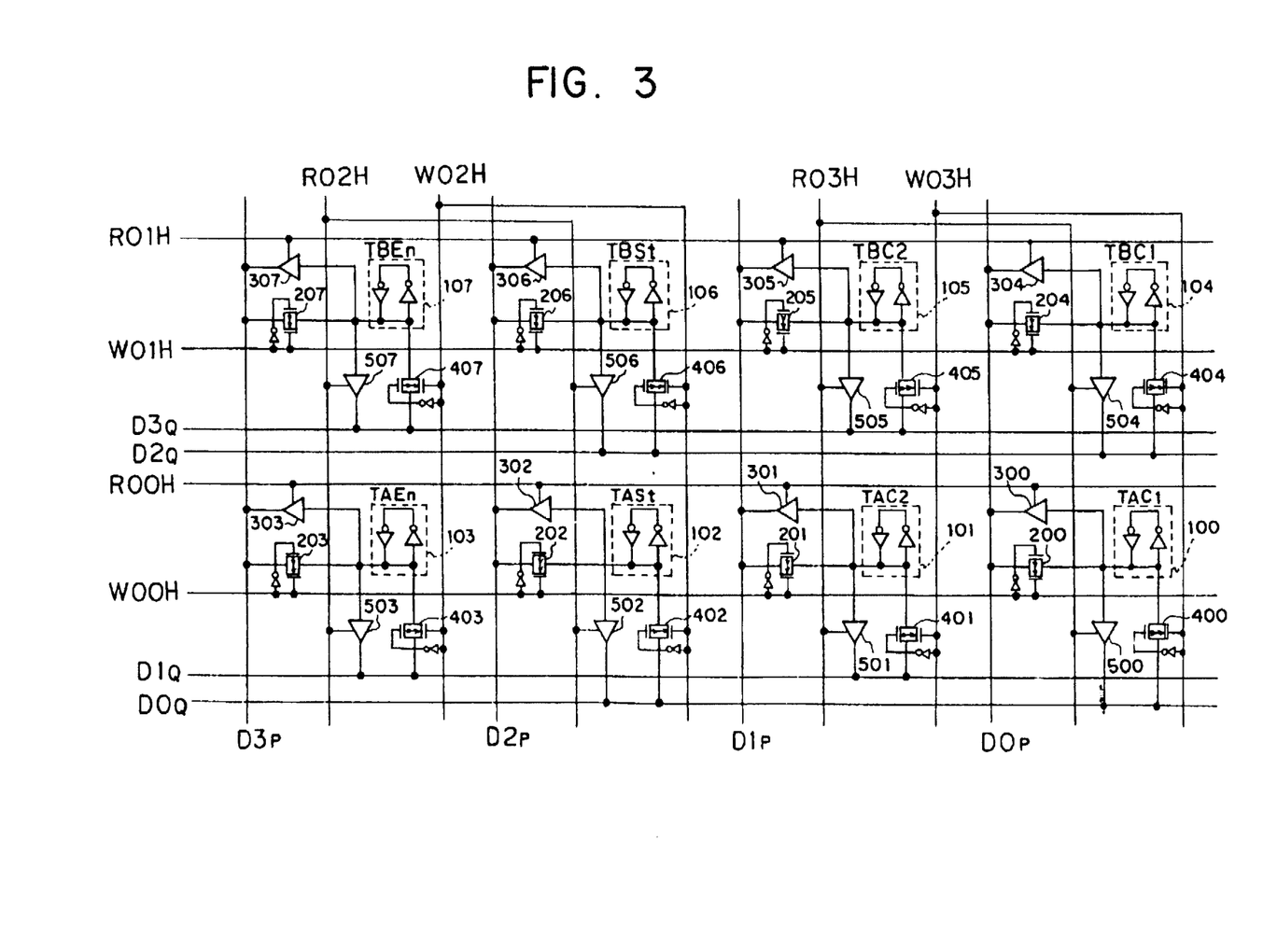
FIG. 3 is a circuit diagram showing a structure of registers in a first embodiment of the present invention.

The group of registers shown in FIGS. 2(A) to 2(D) are arranged as shown in, for example, FIG. 3. The arrangement shown in FIG. 3 includes eight memory cells shown in FIG. 1. That is, in FIG. 3, reference numerals 100 to 107 mean storage portions equivalent to the storage portion 1 in FIG. 1, 200 to 207 are TGs equivalent to the TG 2 in FIG. 1, 300 to 307 are RBs equivalent to the RB 3 in FIG. 1, 400 to 407 are TGs equivalent to the TG 4 in FIG. 1, and 500 to 507 are RBs equivalent to the RB 5 in FIG. 1. Further, reference numerals W00H to W03H mean control lines for writing, and R00H to R03H are control lines for reading. In this case, WxxH becomes active when the CPU is operated to write to an address xx[H], and RxxH is active when the CPU is operated to read out from the address xx[H]. The mark xx means any one of numerals 00 to 03.

In addition, reference numerals $D0_P$ to $D3_P$ mean data lines to pass data of the storage portions 100 to 107 accessed through the control lines W00H and R00H or the control lines W01H and R01H, and $D0_Q$ to $D3_Q$ mean data lines to pass data of the storage portions 100 to 107 accessed through the control lines W02H and R02H or the control lines W03H and R03H.

When the data lines $D0_P$ to $D3_P$ are defined as first data lines, the control lines W00H and R00H or the control lines W01H and R01H can serve as first control lines. Further, the data lines $D0_Q$ to $D3_Q$ serve as second data lines, and the control lines W02H and R02H or the control lines W03H and R03H can serve as second control lines. Therefore, in this case, first access means includes the data lines $D0_P$ to $D3_P$, the control lines W00H and R00H or the control lines W01H and R01H. Further, second access means includes the data lines $D0_Q$ to $D3_Q$, and the control lines W02H and R02H or the control lines W03H and R03H.

For example, when the control line W00H becomes active, the respective TGs 200 to 203 are kept in conduction to store a signal on the data lines $D0_P$, $D1_P$, $D2_P$, and $D3_P$ into the corresponding storage portions 100 to 103. The data lines $D0_P$ and $D0_Q$ serve as a data bus D0 of the CPU, the data lines $D1_P$ and $D1_Q$ serve as a data bus D1 of the CPU, the data lines $D2_P$ and $D2_Q$ serve as a data bus D2 of the CPU, and the data lines $D3_P$ and $D3_Q$ serve as a data bus D3 of the CPU. Thus, four-bit data outputted from the CPU can be stored in the storage portions 100 to 103. When the R00H becomes active, the respective RBs 300 to 303 are kept in conduction to place data of the storage portions 100 to 103 on the corresponding data lines $D0_P$ to $D3_P$. Accordingly, the CPU can be operated to receive, as inputs, the data of the storage portions 100 to 103.

For example, the rightmost lower storage portion 100 can place data on the data line $D0_P$ through the RB 300 when the R00H becomes active, and can place data on the data line $D0_Q$ through the RB 500 when the control line R03H becomes active. Further, the storage portion 100 can receive, as input, a signal on the data line $D0_P$ through the TG 200 when the control line W00H becomes active, and can receive, as input, a signal on the data line $D0_Q$ through the TG 400 when the control line W03H becomes active. The other storage portions 101 to 107 similarly have two data input paths and two data output paths. The respective input/output paths are set so as to implement the address assignment and the bit assignment shown in FIGS. 2(A) to 2(D).

A description will now be given of the operation. It is assumed that a program as shown in FIG. 12 is carried out by the CPU. The CPU is initially operated to read out contents of the register at the address 02[H]. Hence, the control line R02H shown in FIG. 4 becomes active so that data of the storage portions 102, 103, 106, and 107 are outputted to the data buses. That is, data of TASt bit, TAEn bit, TBSt bit, and TBEn bit are outputted to the data buses. In this way, the contents of the register shown in FIG. 2(C) can finally be stored in the CPU. Since the TASt bit shows a TA status flag and the TBSt bit shows a TB status flag, the CPU can be operated to confirm that the TA and the TB are operated in process at the same time.

When one timer, for example, the TA is started, the CPU is operated to set the control bits TAC1 and TAC2 in the register shown in FIG. 2(A) to predetermined values, and control so as to turn ON an enable flag TAEn. In other words, the CPU is operated to place predetermined values indicating desired operation modes and so forth on the data lines D0 and D1 and place one (indicating an active condition) on the data line D3, and control so as to provide the active condition of the control line W00H. Specifically, the CPU is operated to write, onto the address 00[H], "1Δxx" where Δ is undefined, and x is a predetermined value. When the control line W00H becomes active, the TGs 200 to 203 are kept in conduction in a circuit shown in FIG. 3 so that the control bits TAC1 and TAC2 are set to the predetermined values, thereby turning ON the enable flag TAEn. As set forth above, the CPU access to only one register is sufficient to start one timer.

As described above, a plurality of access means are mounted with respect to the bits forming the register, and it is thereby possible to avoid reduction of a program efficiency of a control program.

In an integrated circuit chip, the control lines for writing or reading, and the data lines preferably cross at right angles as shown in FIG. 3. This is because the orthogonal crossing can arrange wiring, and an area for the storage device can be reduced in the chip.

Embodiment 2

Figure 4:
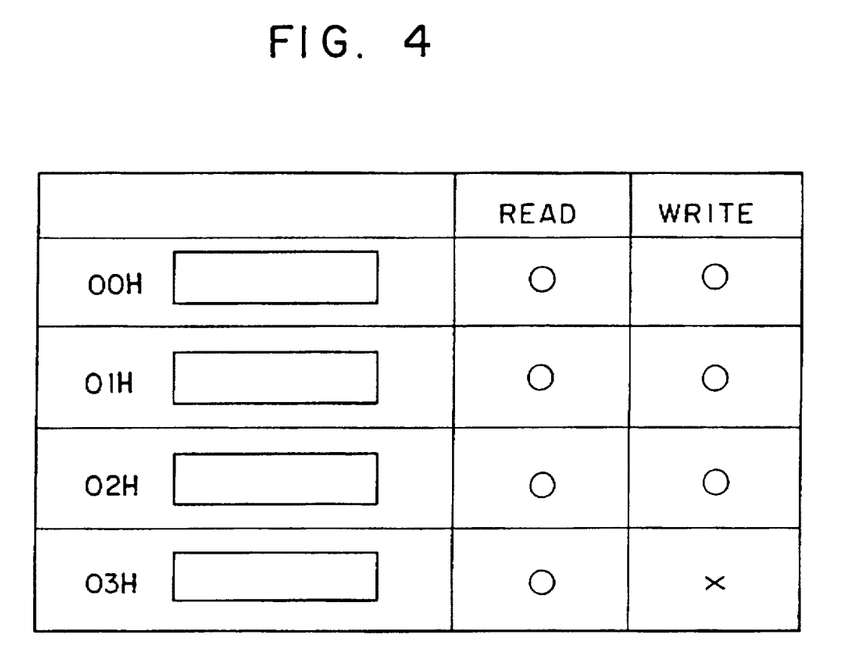
FIG. 4 is an explanatory diagram showing an accessible state of registers in a second embodiment of the present invention.

In structures of registers as shown in FIGS. 2(A) to 2(D), bits can be accessed at a plurality of different addresses. However, erroneous access may be generated due to programming error. A mode of a timer is not set so frequently, and is not set again in many cases if once the mode of the one timer is set. That is, though it is necessary to monitor a setting state of control bits, it is not necessary in many cases to modify the control bits for mode setting. In such a case, there is no major problem even if a register at an address 03[H] is write inhibited as shown in FIG. 4. Further, when the register is write inhibited, it is possible to decrease possibility of modification of the control bits due to the erroneous access.

Figure 5:
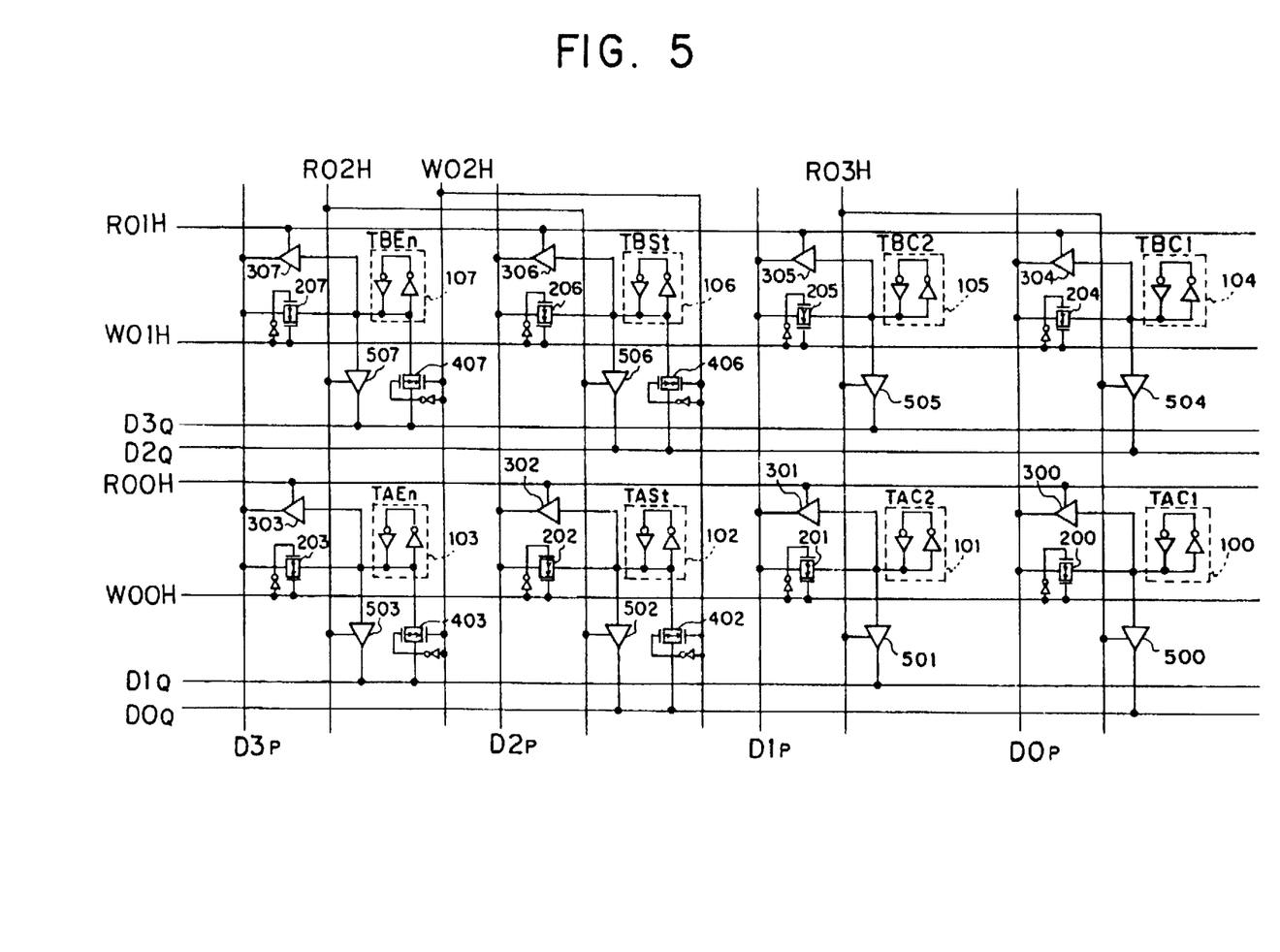
FIG. 5 is a circuit diagram showing a structure of the registers in the second embodiment of the present invention.

FIG. 5 is a circuit diagram showing a structure to implement the above register. The structure shown in FIG. 5 can be obtained by removing a control line W03H from a structure shown in FIG. 3. That is, though second access means includes the control line W03H and a control line R03H in the first embodiment, only the control line R03H is provided in the embodiment. In addition, TGs 400, 401, 404, and 405 are removed, thereby implementing an access method shown in FIG. 4. In this case, values of the control bits TAC1, TAC2, TBC1, and TBC2 are never modified even when the CPU is operated to modify the address 03[H] due to some error.

Embodiment 3

In the above embodiments, descriptions have been given of structures in which bits can be accessed at a plurality of different addresses. However, the above structures result in the increased number of addresses. For example, though a timer can be controlled by only two addresses 00[H] and 01[H] in a conventional structure, the same control in the above timer requires four addresses as shown in FIGS. 2(A) to 2(D). The fact is disadvantageous if a width of an address bus is restricted. In this case, as shown in FIG. 6, the disadvantage can be avoided by a control register 10 which is mounted separately from a timer control register.

Figure 6:
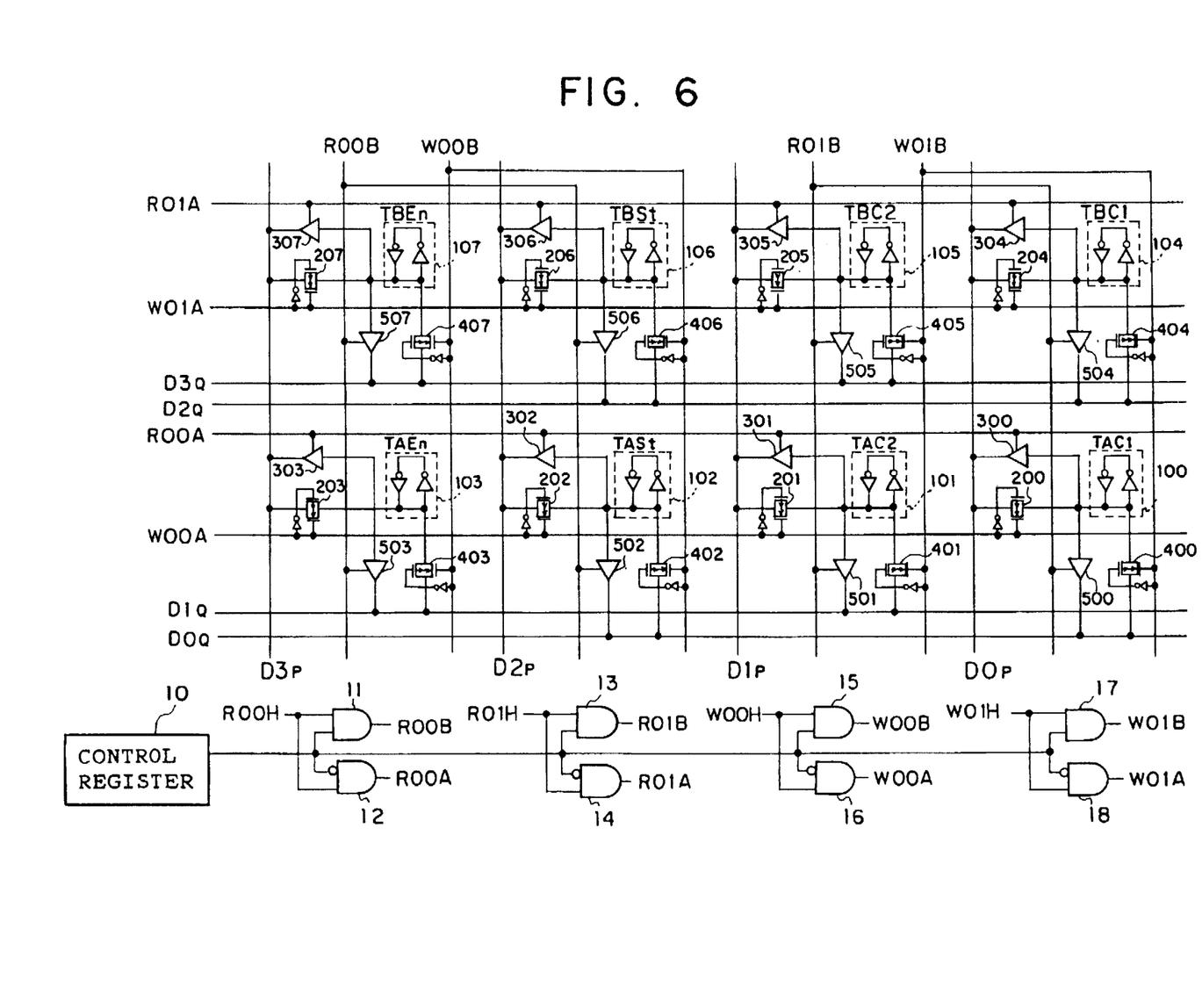
FIG. 6 is a circuit diagram showing a structure of registers in a third embodiment of the present invention.

In FIG. 6, reference numeral 11 means an AND circuit (a gate circuit) to pass a signal on a control line R00H to a control line R00B when the control register 10 is set to one, 12 is a gate circuit to pass the signal on the control line R00H to a control line R00A when the control register 10 is set to zero, 13 is a gate circuit to pass a signal on a control line R01H to a control line R01B when the control register 10 is set to one, and 14 is a gate circuit to pass the signal on the control line R01H to a control line R01A when the control register 10 is set to zero. Further, reference numeral 15 is a gate circuit to pass a signal on a control line W00H to a control line W00B when the control register 10 is set to one, 16 is a gate circuit to pass the signal on the control line W00H to a control line W00A when the control register 10 is set to zero, 17 is a gate circuit to pass a signal on a control line W01H to a control line W01B when the control register 10 is set to one, and 18 is a gate circuit to pass the signal on the control line W01H to a control line W01A when the control register 10 is set to zero.

The control line R00A and the control line W00A are connected to the RBs or the TGs associated with storage portions 100 to 103. The control line R01A and the control line W01A are connected to the RBs or the TGs associated with the storage portions 104 to 107. The control line R00B and the control line W00B are connected to the RBs or the TGs associated with the storage portions 102, 103, 106, and 107. The control line R01B and the control line W01B are connected to the RBs or the TGs associated with the storage portions 100, 101, 104, and 105. Here, the control lines W00A, W01A, W00B, and W01B serve as control lines for writing, and the control lines R00A, R01A, R00B, and R01B serve as control lines for reading. Further, the control lines W00A, W01A, R00A, and R01A correspond to first control lines (i.e., first access means), and the control lines W00B, W01B, R00B, and R01B correspond to second control lines (i.e., second access means).

Figure 7A:
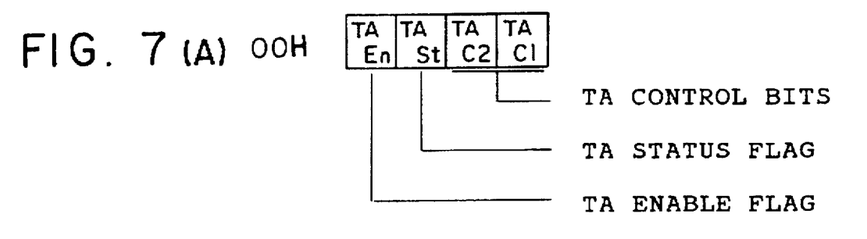
FIGS. 7(A) to 7(D) are explanatory diagrams respectively showing address assignment and bit assignment of timer control registers in the third embodiment of the present invention.
Figure 7B:
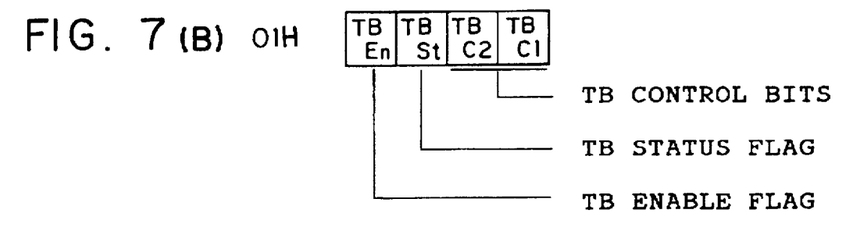
Figure 7C:
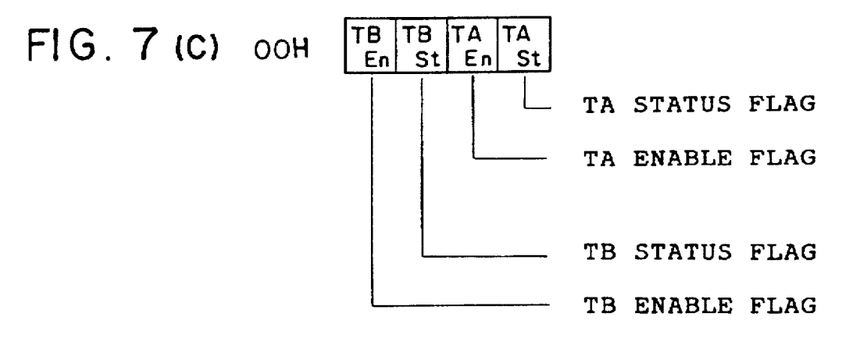
Figure 7D:
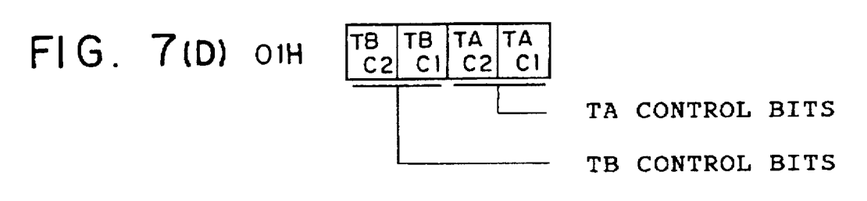

The above structure can implement a group of registers shown in FIGS. 7(A) to 7(D). FIG. 7(A) shows a register which is readable and writable when the control register 10 is set to zero and the CPU is operated to have access to the address 00[H], and FIG. 7(B) shows a register which is readable and writable when the control register 10 is set to zero and the CPU is operated to have access to the address 01[H]. FIG. 7(C) shows a register which is readable and writable when the control register 10 is set to one and the CPU is operated to have access to the address 00[H], and FIG. 7(D) shows a register which is readable and writable when the control register 10 is set to one and the CPU is operated to have access to the address 01[H].

A description will now be given of the operation. It is assumed that a program as shown in FIG. 12 is carried out by the CPU. The CPU is operated to set the control register 10 to one, and to read out contents of the register at the address 00[H]. Then, the control line R00H shown in FIG. 6 becomes active. Since the control register 10 is set to one, the gate circuit 11 is left in conduction and the control line R00B becomes active. Therefore, data of the storage portions 102, 103, 106, and 107 are outputted to data buses. That is, data of TASt bit, TAEn bit, TBSt bit, and TBEn bit are outputted to the data buses. In this way, the contents of the register shown in FIG. 7(C) can finally be stored in the CPU. Since the TASt bit shows a TA status flag and the TBSt bit shows a TB status flag, as in the first embodiment, the CPU can be operated to confirm that the TA and the TB are operated in process at the same time.

Consequently, in the embodiment, it is also possible to provide the same operation as that of address assignment in the first embodiment. However, in this case, the number of addresses assigned to the group of timer control registers may be half the number of addresses assigned thereto in the first embodiment.

Embodiment 4

Figure 8:
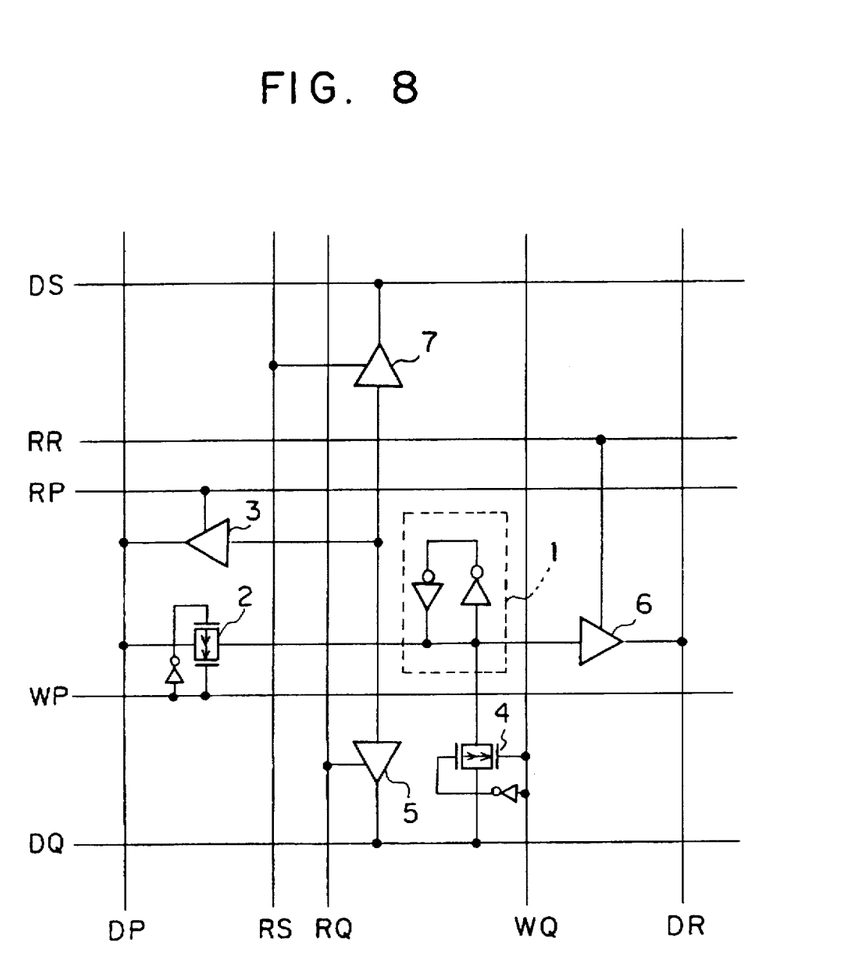
FIG. 8 is a circuit diagram showing another structure of the memory cell in the storage device.

If the number of paths for writing or reading is more increased in each memory cell, more various access methods can be implemented. A structure shown in FIG. 8 can be obtained by adding two readout RBs 6 and 7 to a structure shown in FIG. 1. The RB 6 places data of a storage portion 1 on a data line DR in response to a data read signal on a control line RR, and the RB 7 places the data of the storage portion 1 on a data line DS in response to a data read signal on a control line RS.

Figure 9:
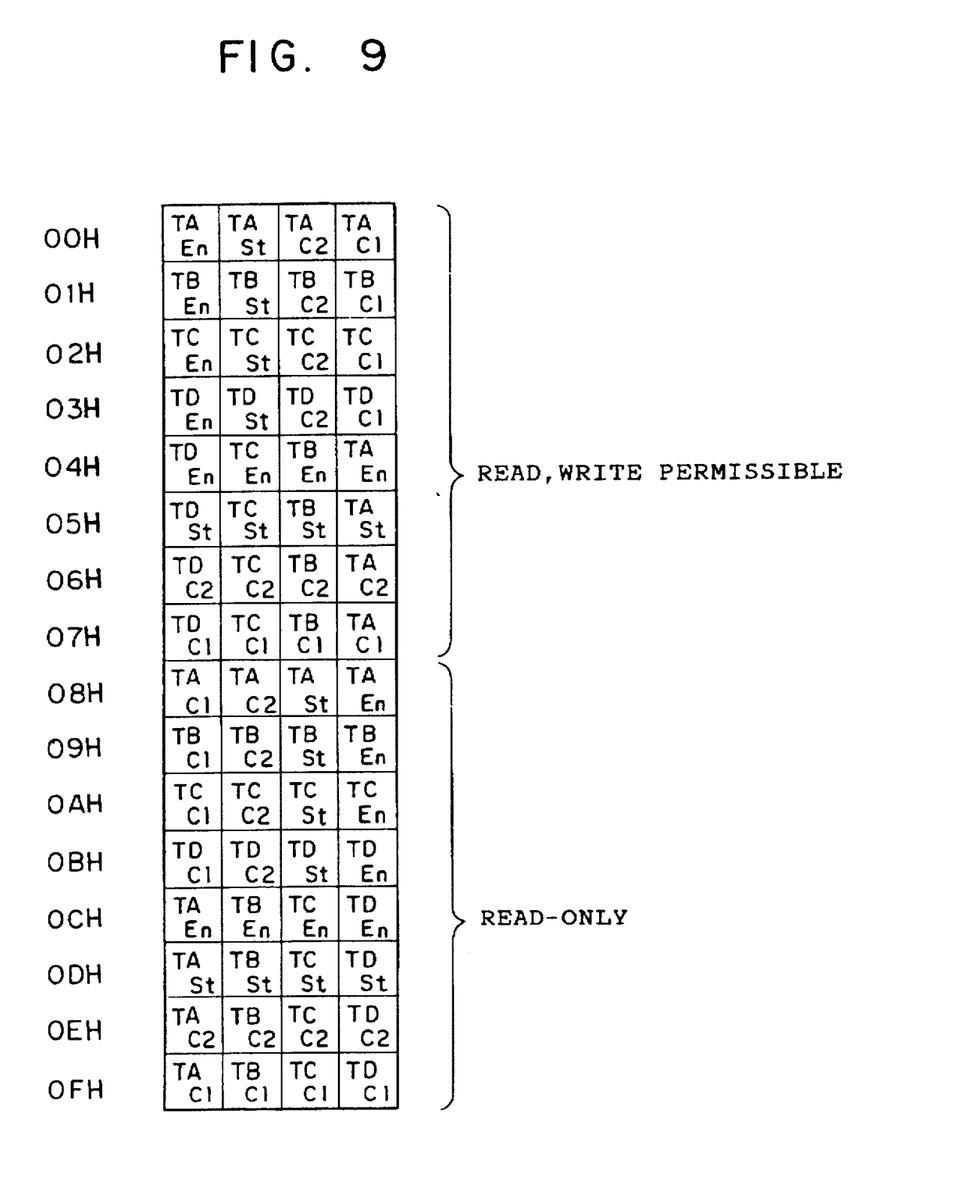
FIG. 9 is an explanatory diagram showing address assignment and bit assignment of timer control registers in a fourth embodiment of the present invention.

Such a memory cell can be used to form a group of registers as shown in FIG. 9. The following discussion will be given of a case where four timers are provided. That is, it is assumed that a third timer (a timer C: TC) and a fourth timer (a timer D: TD) are mounted in addition to two timers.

Functions of the registers are defined as follows:

Register at an address 00[H]: Includes C1 bit, C2 bit, St bit, and En bit associated with TA to control the TA (readable and writable).

Register at an address 01[H]: Includes C1 bit, C2 bit, St bit, and En bit associated with TB to control the TB (readable and writable).

Register at an address 02[H]: Includes C1 bit, C2 bit, St bit, and En bit associated with TC to control the TC (readable and writable).

Register at an address 03[H]: Includes C1 bit, C2 bit, St bit, and En bit associated with TD to control the TD (readable and writable).

Register at an address 04[H]: Includes En bits associated with TA, TB, TC, and TD to control the En bits of the timers (readable and writable).

Register at an address 05[H]: Includes St bits associated with TA, TB, TC, and TD to control the St bits of the timers (readable and writable).

Register at an address 06[H]: Includes C2 bits associated with TA, TB, TC, and TD to control the C2 bits of the timers (readable and writable).

Register at an address 07[H]: Includes C1 bits associated with TA, TB, TC, and TD to control the C1 bits of the timers (readable and writable).

Further, registers at addresses 08[H] to 0F[H] can serve as a read-only register, and include bits in the order opposed to the order of bits in the registers at the addresses 00[H] to 07[H].

Figure 10:
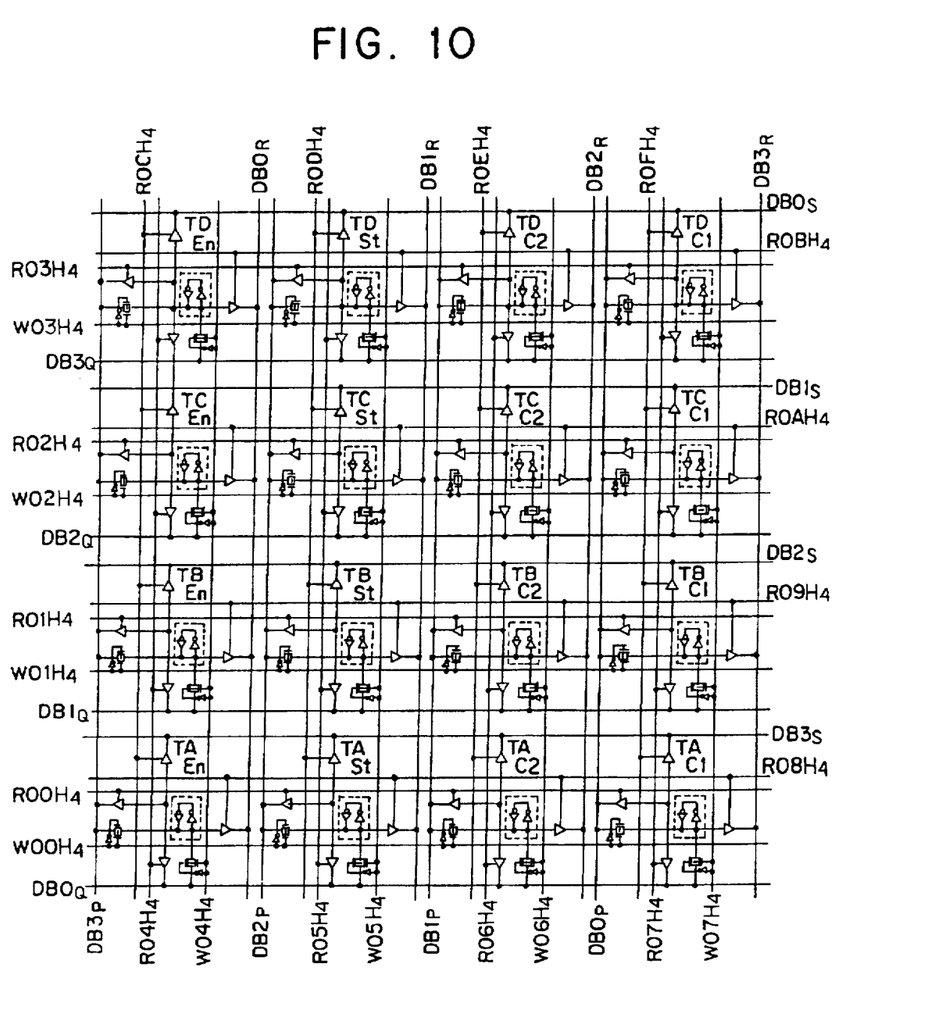
FIG. 10 is a circuit diagram showing a structure of the registers in the fourth embodiment of the present invention.

Such a group of registers can be implemented by a storage device shown in FIG. 10. The storage device shown in FIG. 10 includes memory cells corresponding to the C1 bits, the C2 bits, the St bits, and the En bits of the timers. The memory cells respectively have a structure shown in FIG. 8, and a register access method is identical with that in the first embodiment. However, the number of addresses is increased, the register shown in FIG. 2(C) is divided into an En control register and an St control register, and a register shown in FIG. 2(D) is divided into a C1 control register and a C2 control register.

In a circuit shown in FIG. 10, data lines $DBO_P$ to $DB3_P$ are equivalent to first data lines (i.e., first access means), data lines $DB0_Q$ to $DB3_Q$ are equivalent to second data lines (i.e., second access means), and data lines $DB0_R$ to $DB3_R$ and data lines $DB0_S$ to $DB3_S$ are equivalent to third data lines (i.e., third access means). Further, control lines $W00H_4$ to $W03H_4$, and $R00H_4$ to $R03H_4$ are equivalent to first control lines (i.e., first access means), control lines $W04H_4$ to $W07H_4$ and $R04H_4$ to $R07H_4$ are equivalent to second control lines (i.e., second access means), and control lines $R08H_4$ to $R0FH_4$ are equivalent to third control lines (i.e., third access means). The lower case "4" as used herein simply means a fourth embodiment, and functions of the control lines are entirely identical with those of control lines in the above embodiments.

Such a structure enables concurrent start of the plurality of timers as in the first embodiment. That is, it is sufficient to turn ON a plurality of desired bits of the register at the address 04[H]. Further, it is possible to start one timer simply by providing access to one register. For example, when TA is started, it is possible to set a mode and start the TA simply by providing access to the register at the address 00[H]. When the CPU is operated to write a predetermined data onto the address 00[H], the control line $W00H_4$ becomes active in the circuit shown in FIG. 10. Consequently, the data can be stored in the TAEn bit, the TASt bit, the TAC2 bit, and the TAC1 bit.

In addition, the registers are mounted at the addresses 08[H] to 0F[H] to facilitate decision processing and so forth. For example, it is assumed that a state decision is made by right-shift processing. In order to make a state decision of the TBC1 bit, it is sufficient to read out at the address 07[H], and shift the read data twice to the right. A state decision of the TCC1 can be made by reading out at the address 0F[H], and shifting the read data twice to the right. If the address 0F[H] is not present, the state decision of the TCC1 is made by reading out at the address 07[H] and shifting the read data three times to the right.

Further, the addresses 08[H] to 0F[H] enable readout of data in which an MSB (most significant bit) and an LSB (least significant bit) are reversely set, thereby facilitating an interface with another CPU or the like. For example, it is assumed that one MSB in a serial I/O circuit built in one microcomputer is set reversely to the other MSB in another serial I/O circuit built in the other microcomputer. In this case, the registers are regarded as not the control registers but data registers. Register access may be performed by using one address (such as 00[H]) to carry out data processing in the one microcomputer. In order to send data to the other microcomputer, another register access is performed by using an address (such as 08[H]) by which access can be gained to a register having bits in the order opposed to that of bits in the register accessed at the address 00[H]. Data obtained by the access can be sent to the other microcomputer, and the other microcomputer can receive the data to use the received data as it is.

When there is not provided the access method in the embodiment, the MSB and the LSB must be reversely set in a CPU of the one microcomputer or the other microcomputer, resulting in reduction of a program efficiency.

As set forth above, addressing enables the access to the data in which the MSB and the LSB are reversely set. It is thereby possible to facilitate interface processing and decision processing.

Though the description have been given of a case where the first access means, the second access means, and the third access means are mounted so as to provide the access to the storage portion from different directions, only the first access means and the third access means may be mounted. That is, the present invention may be applied to a structure which enables only the access to the data in which the MSB and the LSB are reversely set.

In an integrated circuit chip, the control lines for writing or reading, and the data lines preferably cross at right angles as shown in FIG. 10. This is because the orthogonal crossing arranges wiring, and an area for the storage device can be reduced in the chip.

As stated above, in the storage device, the storage portion can be accessed by the plurality of access means at the different addresses. Consequently, it is possible to select the optimal method of access to the storage portion, resulting in prevention of reduction of the program efficiency.

Alternatively, in the storage device, the second access means has concurrent access to a predetermined number of storage portions including the storage portions accessed by the first access means and other storage portions which is not accessed by the first access means. Consequently, it is possible to provide access to batch data having the optimal bit array, avoid an extension of a size of the program, and simplify production of the program.

Alternatively, in the first access means and the second access means of the storage device, the data lines and the control lines respectively cross at right angles. Consequently, in addition to the above effects, there is another effect of a smaller chip of the storage device.

Alternatively, in the storage device, data can be placed from the storage portion on the second data line, and data input from the second data line into the storage portion is prevented. Consequently, it is possible to decrease possibility of modification of data in the storage device due to the erroneous access, thereby providing higher security.

Alternatively, in the storage device, the storage portion is accessed by using a signal generated by an address signal from the data access side. Consequently, a plurality of access means can be implemented by a simple access method.

Alternatively, in the storage device, the storage portion is accessed by using a signal generated by both an address signal from the data access side and a control value. Consequently, it is possible to select an address according to the control value, resulting in reduction of the number of addresses required for the access.

Alternatively, in the storage device, the storage portion can be accessed by the third access means in a batch data format having bits in the order opposed to that of bits in a batch data accessed by another access means. Consequently, it is possible to select a more suitable method of access to the storage portion, resulting in more effective prevention of reduction of the program efficiency.

Alternatively, in the first access means, the second access means, and the third access means of the storage device, the data lines and the control lines respectively cross at right angles. Consequently, in addition to the above effects, there is another effect of a smaller chip of the storage device.

While preferred embodiments of the invention have been described using specific terms, such description is for illustrative purposes only, and it is to be understood that changes and variations may be made without departing from the spirit or scope of the following claims.

What is claimed is:

1. A storage device for containing data and performing an input/output operation of the data according to addressing, and the storage device comprising:

a plurality of storage portions to respectively contain bit data;

first access means including a first data line to pass data to the storage portion and data from the storage portion, and a first control line to connect the storage portion to the first data line, for providing concurrent access to a predetermined number of storage portions in the plurality of storage portions; and third access means including a third data line to pass data to the storage portion and data from the storage portion, and a third control line to connect the storage portion to the third data line so as to provide access to batch data having bits in the order opposed to that of bits in a batch data accessed by the first access means;

wherein the first data line and the third data line cross at right angles, and the first control line and the third control line crossing at right angles.

2. A storage device for containing data and performing an input/output operation of the data according to addressing, and the storage device comprising:

a plurality of storage portions to respectively contain bit data;

first access means for providing concurrent access to a first predetermined number of storage portions in the plurality of storage portions; and second access means for providing concurrent access to a second predetermined number of storage portions in the plurality of storage portions;

wherein the first predetermined number of storage portions includes common storage portions accessed by the second access means and other storage portions not accessed by the second access means, and the second predetermined number of storage portions includes the common storage portions accessed by the first access means and other storage portions not accessed by the first access means.

3. A storage device according to claim 2, wherein the first access means includes a first data line to pass data to the storage portion and data from the storage portion, and a first control line to connect the storage portion to the first data line, the second access means including a second data line to pass data to the storage portion and data from the storage portion, and a second control line to connect the storage portion to the second data line, the first data line crossing the second data line at right angles, and the first control line crossing the second control line at right angles.

4. A storage device according to claim 2, wherein the first access means includes a first data line to pass data to the storage portion and data from the storage portion, and a first control line to connect the storage portion to the first data line, the second access means including a second data line to pass data to the storage portion and data from the storage portion, and a second control line to place the data from the storage portion on the second data line and inhibit data input from the second data line into the storage portion.

5. A storage device according to claim 2, wherein a first control line and a second control line use a signal generated by an address signal from the data access side.

6. A storage device for containing data and performing an input/output operation of the data according to addressing, and the storage device comprising:

a plurality of storage portions to respectively contain bit data;

first access means for providing concurrent access to a predetermined number of storage portions in the plurality of storage portions; and second access means for providing concurrent access to a predetermined number of storage portions including the storage portions accessed by the first access means and other storage portions not accessed by the first access means; and a control register including a control value set by the data access side;

wherein a first control line for controlling said first access means and a second control line for controlling said second access means use a signal generated by both an address signal from the data access side and the control value.

7. A storage device for containing data and performing an input/output operation of the data according to addressing, and the storage device comprising:

a plurality of storage portions to respectively contain bit data;

first access means for providing concurrent access to a predetermined number of storage portions in the plurality of storage portions; and second access means for providing concurrent access to a predetermined number of storage portions including the storage portions accessed by the first access means and other storage portions not accessed by the first access means; and third access means including a third data line to pass data to the storage portion and data from the storage portion, and a third control line to connect the storage portion to the third data line so as to provide access to batch data having bits in the order opposed to that of bits in a batch data accessed by either or both of the first access means and the second access means.

* * * * *